US009847209B2

(12) United States Patent
Sender et al.

(10) Patent No.: US 9,847,209 B2
(45) Date of Patent: Dec. 19, 2017

(54) INSPECTION OF REGIONS OF INTEREST USING AN ELECTRON BEAM SYSTEM

(71) Applicant: APPLIED MATERIALS ISRAEL LTD., Rehovot (IL)

(72) Inventors: Benzion Sender, Modiin-Macabim-Reut (IL); Alon Litman, Ness Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/207,024

(22) Filed: Jul. 11, 2016

(65) Prior Publication Data

US 2016/0322195 A1  Nov. 3, 2016

Related U.S. Application Data

(63) Continuation of application No. PCT/US2015/011050, filed on Jan. 12, 2015, which is a continuation-in-part of application No. 14/153,923, filed on Jan. 13, 2014, now Pat. No. 9,466,462.

(51) Int. Cl.
*H01J 37/26* (2006.01)

(52) U.S. Cl.
CPC ......... *H01J 37/265* (2013.01); *H01J 2237/15* (2013.01); *H01J 2237/202* (2013.01); *H01J 2237/20228* (2013.01); *H01J 2237/28* (2013.01)

(58) Field of Classification Search
None
See application file for complete search history.

(56) References Cited

U.S. PATENT DOCUMENTS 5,502,306 A  3/1996  Meisburger et al.
5,869,833 A  2/1999  Richardson et al.
(Continued)

FOREIGN PATENT DOCUMENTS

JP  2000215834    8/2000
JP  2009507352 A  2/2009
(Continued)

OTHER PUBLICATIONS

U.S. Appl. No. 14/795,793, "First Action Interview Pilot Program Pre-Interview Communication", dated May 11, 2017, 4 pages.
(Continued)

*Primary Examiner* — Phillip A Johnston
(74) *Attorney, Agent, or Firm* — Kilpatrick Townsend & Stockton LLP (57) ABSTRACT

A system for scanning a plurality of regions of interest of a substrate using one or more charged particle beams, the system comprises: an irradiation module having charged particle optics; a stage for introducing a relative movement between the substrate and the charged particle optics; an imaging module for collecting electrons emanating from the substrate in response to a scanning of the regions of interest by the one or more charged particle beams; and wherein the charged particle optics is arranged to perform countermovements of the charged particle beam during the scanning of the regions of interest thereby countering relative movements introduced between the substrate and the charged particle optics during the scanning of the regions of interest.

20 Claims, 5 Drawing Sheets

(56) References Cited

U.S. PATENT DOCUMENTS

| | | | |
|---|---|---|---|
| 6,570,155 B1 | 5/2003 | Prior et al. | |
| 6,759,655 B2 | 7/2004 | Nara et al. | |
| 7,095,022 B2 * | 8/2006 | Nakasuji | B82Y 10/00 250/310 |
| 7,253,410 B1 | 8/2007 | Bertsche et al. | |
| 7,253,645 B2 * | 8/2007 | Talbot | G06T 7/0004 250/310 |
| 7,897,942 B1 * | 3/2011 | Bareket | G03B 27/62 250/398 |
| 7,994,476 B2 | 8/2011 | Bullock et al. | |
| 8,063,363 B2 | 11/2011 | Yeh et al. | |
| 8,378,320 B2 | 2/2013 | Platzgummer et al. | |
| 8,497,475 B2 | 7/2013 | Yeh et al. | |
| 8,884,224 B2 | 11/2014 | Jau et al. | |
| 2005/0279936 A1 | 12/2005 | Litman et al. | |
| 2006/0245636 A1 | 11/2006 | Kitamura et al. | |
| 2008/0122462 A1 | 5/2008 | Nozoe et al. | |
| 2008/0277598 A1 | 11/2008 | Satoh et al. | |
| 2009/0050802 A1 | 2/2009 | Noji et al. | |
| 2009/0134340 A1 | 5/2009 | Furuhashi et al. | |
| 2009/0242761 A1 | 10/2009 | Yeh et al. | |
| 2009/0256075 A1 | 10/2009 | Kemen et al. | |
| 2010/0072365 A1 | 3/2010 | Shoham et al. | |
| 2012/0305768 A1 | 12/2012 | Yamamoto et al. | |
| 2015/0200071 A1 | 7/2015 | Sender et al. | |
| 2015/0311031 A1 | 10/2015 | Platzgummer et al. | |
| 2017/0011883 A1 | 1/2017 | Lev et al. | |

FOREIGN PATENT DOCUMENTS

| | | | |
|---|---|---|---|
| JP | 4997076 A | 6/2009 | |
| JP | 2017504175 A | 2/2017 | |
| KR | 1020080087138 A | 9/2008 | |
| KR | 10-1751663 B1 | 6/2017 | |
| TW | 201106411 A | 2/2011 | |
| TW | 201237443 A | 9/2012 | |
| WO | 2015106212 | 7/2015 | |

OTHER PUBLICATIONS

TW104101097, "Office Action", dated May 24, 2017, 4 pages.

U.S. Appl. No. 14/153,923 , "Final Office Action", dated Apr. 19, 2016, 8 pages.

U.S. Appl. No. 14/153,923 , "Non-Final Office Action", dated Sep. 2, 2015, 9 pages.

U.S. Appl. No. 14/153,923 , "Notice of Allowance", dated Jul. 20, 2016, 5 pages.

PCT/US2015/011050 , "International Preliminary Report on Patentability", dated Jul. 28, 2016, 9 pages.

PCT/US2015/011050 , "International Search Report and Written Opinion", dated Apr. 29, 2015, 12 pages.

U.S. Appl. No. 14/795,793, "Restriction Requirement", dated Feb. 16, 2017, 6 pages.

KR10-2016-7021872, "Notice of Decision to Grant", dated Mar. 21, 2017, 2 pages.

First Action Interview Office Action Summary for related U.S. Appl. No. 14/795,793 dated Aug. 7, 2017, 4 pages.

Decision of Patent Examination by Intellectual Property Office Ministry of Economic Affairs for related Taiwanese Patent Application No. 104101097 dated Aug. 15, 2017, 4 pages. English Translation.

U.S. Appl. No. 14/795,793, "Final Office Action", Oct. 4, 2017, 9 pages.

* cited by examiner

INSPECTION OF REGIONS OF INTEREST USING AN ELECTRON BEAM SYSTEM

CROSS-REFERENCE TO RELATED APPLICATIONS

This application is a continuation of International Application No. PCT/US2015/011050, filed Jan. 12, 2015, which is a continuation-in-part of U.S. application Ser. No. 14/153,923, filed Jan. 13, 2014, both of which are incorporated herein by reference in their entirety for all purposes.

BACKGROUND OF THE INVENTION

Electron beam inspection tools exhibit high resolution but are relatively slow. Scanning an entire wafer with a high resolution electron beam is very lengthy and thus may limit the usage of electron beam systems.

There is a growing need of a system and method for providing high throughput and high resolution inspection of wafers.

BRIEF SUMMARY OF THE INVENTION

A method and a system for inspecting regions of interest using an electron beam.

According to an embodiment of the invention there is provided a system for scanning a plurality of regions of interest of a substrate using one or more charged particle beams, the system comprises: an irradiation module having charged particle optics; a stage for introducing a relative movement between the substrate and the charged particle optics; an imaging module for collecting electrons emanating from the substrate in response to a scanning of the regions of interest by the one or more charged particle beams; and wherein the charged particle optics is arranged to perform countermovements of the charged particle beam during the scanning of the regions of interest thereby countering relative movements introduced between the substrate and the charged particle optics during the scanning of the regions of interest.

According to an embodiment of the invention, a length of the region of interest may be in the range between 0.25 micron to 2 microns and a length of a movement of stage during a scan of the region of interest may be in the range between 0.25 micron to 200 micron. The substrate may be a wafer or a reticle, photomask and the like.

According to an embodiment of the invention, the system may include charged particle optics that is arranged to move the charged particle beam, during a scan of a region of interest, in a scan pattern along a first direction and along a second direction oriented with respect to the first direction, and wherein a performing of a countermovement of the charged particle beam comprises moving the charged particle beam along the first direction.

According to an embodiment of the invention, the stage may be arranged to introduce the relative movement by moving the substrate at a constant speed; and wherein the charged particle optics is arranged to perform a countermovement of the charged particle beam under a control of a control signal having a saw tooth shape.

According to an embodiment of the invention, the system further comprises a controller that is arranged, for each combination of charged particle beam and a scan of a region of interest, to generate a control signal for adjusting a position of the charged particle beam in response to stage position information.

According to an embodiment of the invention, the charged particle optics is one of a group consisting of: a single charged particle column generating a single charged particle beam, a multi charged particle column structure wherein each charged particle column is generating a single beam, and a single charged particle column generating a plurality of charged particle beams.

According to an embodiment of the invention, the charged particle beam may be an electron beam. According to another embodiment of the invention, the charged particle beam is an ion beam.

According to an embodiment of the invention, the system may be arranged to scan the one or more charged particle beams over an entire surface of the substrate. According to an embodiment of the invention, an overall area of all the regions of interest may be a fraction of an area of the wafer. According to another embodiment of the invention, at least some regions of interest may have an area that is less than one percent of the field of view.

According to an embodiment of the invention there is provided a method for scanning a plurality of regions of interest of a substrate, the method comprising: introducing a relative movement between the substrate and the charged particle optics; during the introducing of the relative movement scanning the regions of interest by the one or more charged particle beams; wherein the scanning comprises performing countermovements of the charged particle beam during the scanning of the regions of interest thereby countering relative movements introduced between the substrate and the charged particle optics; and collecting electrons emanating from the substrate in response to the scanning of the regions of interest by the one or more charged particle beams.

The method may include moving the charged particle beam, during a scan of a region of interest, in a scan pattern along a first direction and along a second direction oriented with respect to the first direction, and wherein the performing of a countermovement of the charged particle beam comprises moving the charged particle beam along the first direction.

The method may include introducing the relative movement by moving the substrate at a constant speed; and performing the countermovement of the charged particle beam under a control of a control signal having a saw tooth shape.

The method may include generating, for each combination of charged particle beam and a scan of a region of interest, a control signal for adjusting a position of the charged particle beam in response to stage position information.

A length of the region of interest may be between 0.25 micron to 2 microns and a length of a movement of stage during a scan of the region of interest may be between 0.25 micron to 200 microns.

The charged particle optics may be one of a group consisting of: a single charged particle column generating a single charged particle beam, a multi charged particle column structure wherein each charged particle column may be generating a single beam, and a single charged particle column generating a plurality of charged particle beams.

The substrate may be a wafer.
The substrate may be a reticle.
The charged particle beam may be an electron beam.
The charged particle beam may be an ion beam.
The scanning may include scanning the one or more charged particle beams over an entire surface of the substrate.

The overall area of all the regions of interest may be a fraction of an area of the wafer.

At least some regions of interest have an area that may be less than one percent of the field of view.

The method may include collecting electrons emanating from the substrate in response to multiple scans of a same region of interest by the one or more charged particle beams; wherein at least two scans of the multiple scans differ from each other by at least one image acquisition condition.

At least two regions of interest differ from each other by at least one out of shape and size.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 illustrates a system and a wafer according to an embodiment of the invention; and It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

According to an embodiment of the invention there is provided a method and system for scanning regions of interest by an electron beam. The aggregate size of all the regions of interest is small in relation to the overall size of the wafer and thus a high resolution scan of only the regions of interest can speed up the inspection process. Furthermore, the regions of interest may be scanned while moving the wafer using scanning patterns that include countermovement elements—thus allowing longer scan periods without slowing the speed of the mechanical movement.

Figure 1:
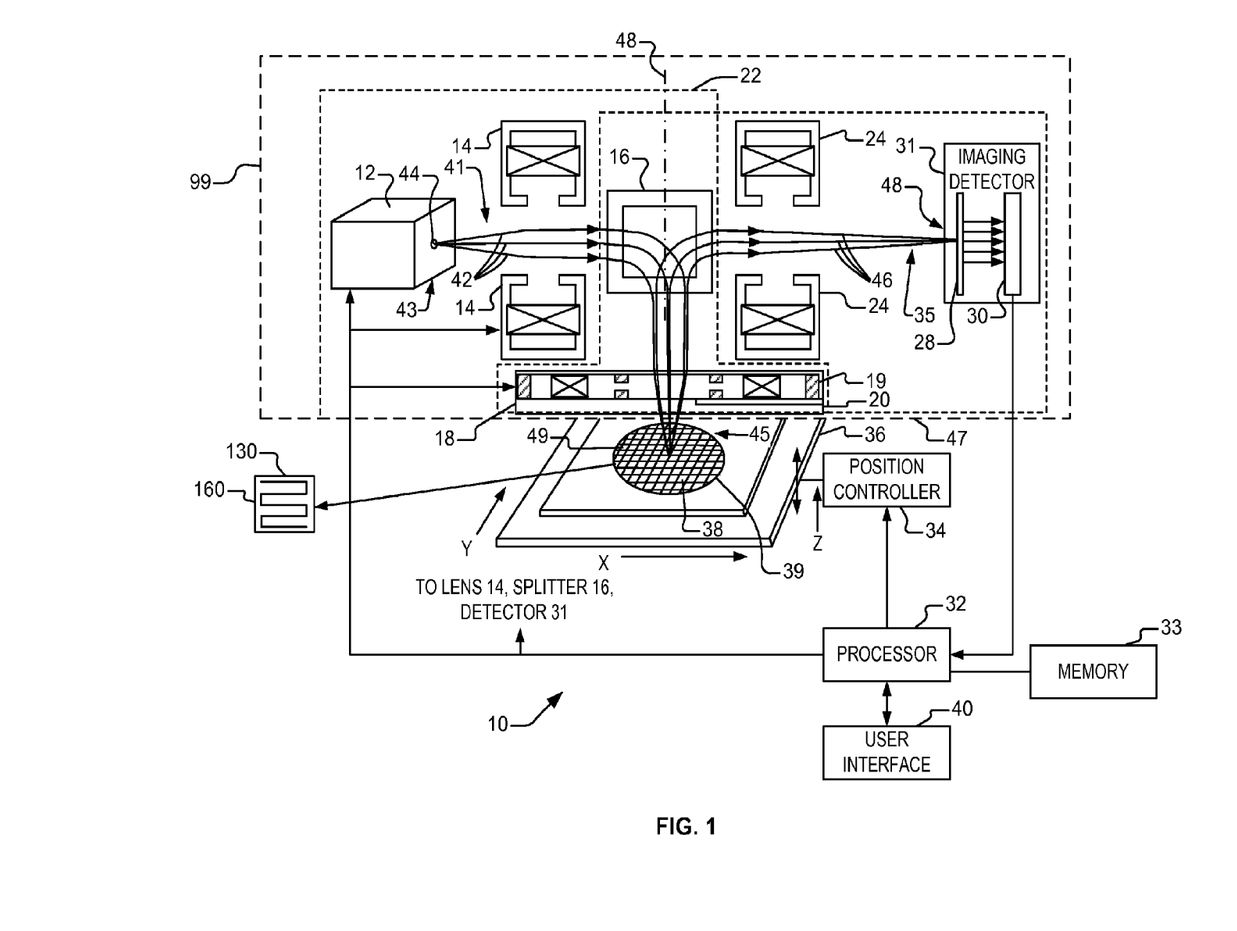
FIG. 1 illustrates a wafer and a system according to an embodiment of the invention.

Reference is now made to FIG. 1, which is a schematic diagram of a single column, single beam system 10, according to an embodiment of the present invention. System 10 includes a charged particle beam irradiation module 22, which, by way of example, is assumed to generate a single primary charged particle beam 41 from an aperture 44 of a charged particle gun 12. However, the scope of the present invention is not limited to generation of a single charged particle beam, so that module 22 may be configured to generate multiple beams. Irradiation module 22 and imaging module 47 form electron optics 99.

Furthermore, the scope of the present invention is not limited to a particular type of charged particle, and includes substantially all types of charged particles, including electrons and ions such as Gallium or other metallic ions. By way of example, the description below assumes that the primary charged particle beam comprises electrons.

Module 22 comprises one or more illumination lenses 14, a beam splitter 16, and an objective lens 18, the lenses acting as focusing elements. Typically, the one or more lenses 14 and beam splitter 16 operate magnetically, although the lenses and/or the beam splitter may also incorporate other types of operation, such as electrostatic operation or a combination thereof.

Beam 41 follows an irradiation path 42 through module 22, and along an axis 48, to a surface 38 of a wafer 39, axis 48 typically being orthogonal to the surface.

Figure 2:
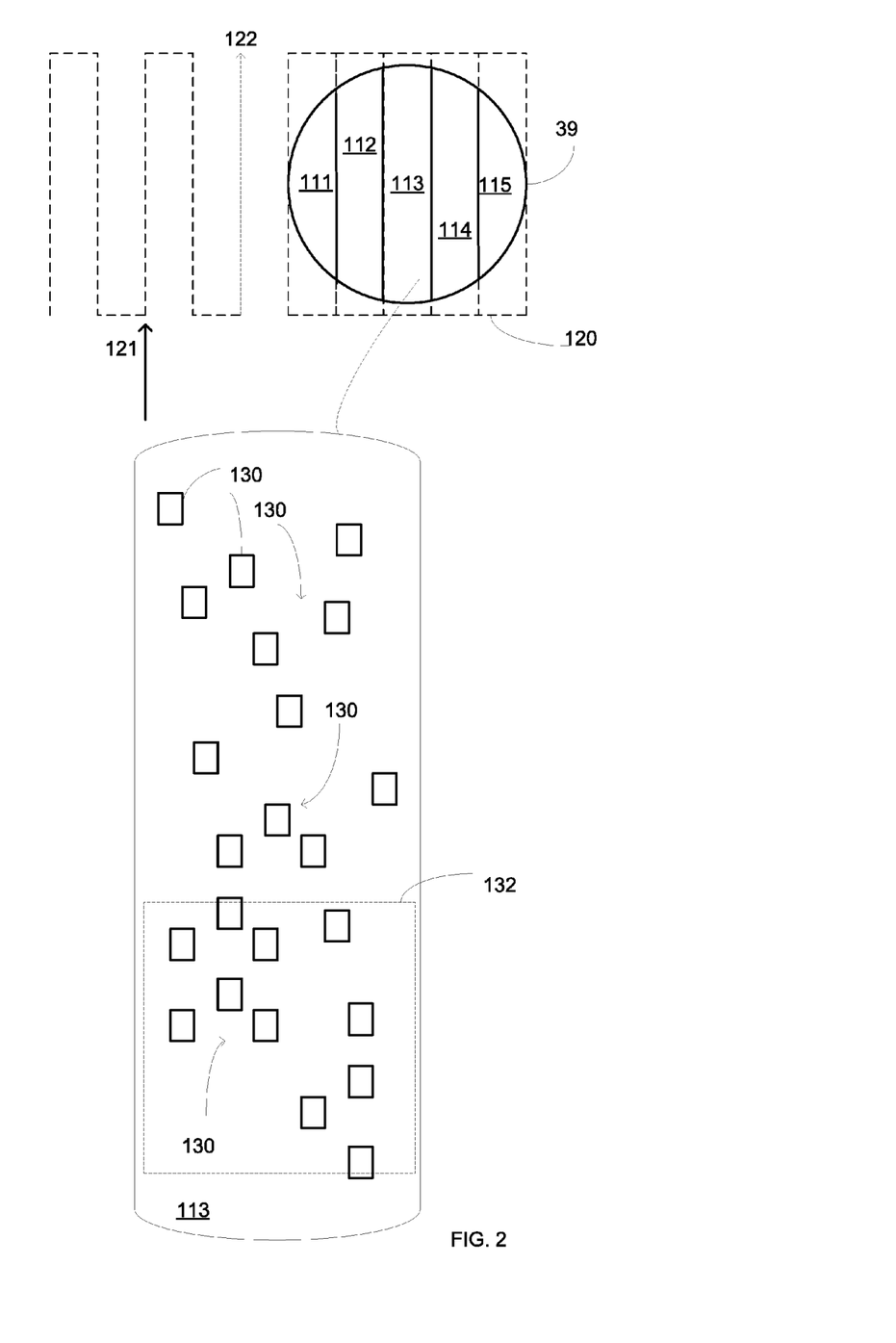
FIG. 2 illustrates a wafer, a mechanical movement pattern an area of a wafer, and multiple regions of interest embodiment of the invention.

FIG. 2 illustrates a wafer 39, a mechanical scan pattern 122 and five areas (slices) 111-115 that are imaged during five scan iterations that form a mechanical scan pattern 122. Wafer 39 is mounted on a movable stage (stage 36 illustrated in FIG. 1), which is assumed to be able to translate the wafer parallel to three orthogonal axes X, Y, and Z, and the XY plane is assumed to be horizontal (axes X, Y and Z as shown in FIG. 1). In this example, scan pattern 122 is composed of vertical direction 121 which is parallel to axis Y, and an orthogonal displacement parallel to axis X. it should be noted that the invention is not limited by the manner by which the relative movement of the wafer and the electron optics is provided. The one or more lenses 14, beam splitter 16, and objective lens 18 form beam 41 into a focused image 45, herein below also referred to as a spot 45, of aperture 44 on surface 38. FIG. 2 also illustrates area 113 that has an elongated shape (a slice) and includes multiple regions of interest 130.

Referring back to FIG. 1-FIG. 1 also illustrates a field of view 132 of the electron optics at a certain point of time during the mechanical scanning of the wafer 39.

The field of view 132 may be of a maximal area that can be viewed by the electron optics without mechanical movement of stage 39, or of any smaller area. FIG. 1 also illustrates a raster scan pattern 160 of spot 45 over a region of interest 130. According to embodiments of the invention, the spot 45 is scanned in a continuous manner in the one direction and displaced in the perpendicular direction.

Referring back to FIG. 1—Spot 45 generates reflected, secondary, and/or back-scattered electrons as a secondary charged particle beam 35 of electrons, which passes through objective lens 18, and beam splitter 16. The secondary beam from spot 45 follows an imaging path 46, via an imaging lens 24 to an electron detector 28. Electron detector 28, typically a phosphor screen comprised of a scintillator crystal or a granulated scintillator powder, converts secondary beam 35 of electrons to optical radiation, which is imaged by an imager 30, such as a charge coupled detector (CCD) array. Detector 28 and imager 30 are typically combined as one unit, and act as an imaging detector 31 of the secondary beam, generating a signal indicative of the beam current. Alternatively, imaging detector 31 may comprise an avalanche photodiode array which directly detects secondary beam 35 without conversion to light. Lenses 18 and 24, beam splitter 16, and imaging detector 31 comprise an imaging module 47 for system 10. The signal generated by imaging module 47 is transferred to a processor 32 coupled to a memory 33.

Processor 32 is coupled to gun 12, lenses 14, beam splitter 16, objective lens 18, imaging lens 24, and imaging detector 31, so as to control their operation and the focus of spot 45, and also so as to act as an overall controller of system 10. It should be noted that the invention is not limited to the system architecture that is illustrated in FIG. 1 and can be implemented by particle beam imaging systems with various configurations.

Typically, stage 36 moves in a continuous manner and in a fixed velocity along mechanical scan pattern 122 in X-Y plane, while processor 32 scans the electron beam (thereby scanning spot 45) according to scanning patterns that scans region of interests and may skip regions that differ from the regions of interest.

The regions of interest may be fed to the system 10 or may be detected by system 10. These regions of interest may be fed by an operator of the system or any other person or device. They may be selected based upon a scanning of previous wafer, based on design information, based upon results of an optical inspection or another grosser resolution process and the like. It should be noted that the invention is not limited by the type of the regions of interest or by the manner and way they are provided to or generated by processor 32.

Herein below it is assumed that processor 32 receives operating parameters from an operator of the system via a user interface 40, which enables the operator to adjust settings of the system components described above, as well as other components of system 10 described below. Processor 32 is also coupled to, and operates, a position controller 34. Under command of the processor, controller 34 is able to adjust stage 36 in a vertical direction.

According to an embodiment of the invention the electron optics are arranged to scan the regions of interest by electron beam (thereby the spot 45). Once a region of interest (130) is scanned the system continues to scan the next region of interest. The order of the region of interest to be scanned may be set in advance or be partially random. The order may take into account the mechanical movement of the wafer (enabled by the movement of stage 36) and may jump the electron beam between regions of interest that are proximate to each other.

According to an embodiment of the invention electron optics are arranged to repeat, for each region of interest: (i) direct the electron beam towards the region of interest 130 of the wafer; the region of interest 130 may be a fraction of a field of view or consist the entire field of view of the electron optics or part of the field of view; scanning the region of interest (130) according to a first scanning pattern (160) of the electron beam (also referred to as primary charged particle beam 41) while moving the wafer 39, along the first direction (for example vertical direction 121 of FIG. 2), so that the region of interest passes in front an imaginary stationary point during a first period—thus the time that the wafer 39 moves a distance that equals the length of the region of interest along the first direction is the first period.

In other words, typically, the region of interest is scanned by a resultant, combined movement in the X-Y plane, that is composed of the following movement elements: stage movement (wafer movement) in one direction (e.g. the Y direction), electron beam scan movement e.g. in a raster scan pattern (for example, continuous scan in the one direction and displacement in the perpendicular direction—scan pattern 160 shown in FIG. 1).

Optionally, a position compensation movement may be provided, by moving the electron beam to an adjusted start position, to compensate for positioning errors e.g. stage mechanical movement errors. The position compensation movement may be defined by the processor 32 in response to measurements of the position of the stage which are carried out continuously e.g. by a stage interferometer component (not shown in FIG. 1).

According to the present invention, an additional electron beam movement is added during scan—a countermovement of the electron beam in the stage movement direction, to compensate for the shift of the stage in this direction during the electron beam scan movement. Due to the electron beam countermovement, the stage can move faster during the electron beam scan movement. Stage velocity therefore can be increased, and thereby overall throughput is increased without derogating from the quality of the scanning.

For example, the operation of a system as illustrated in FIG. 1 may be characterized by the following parameters: stage constant velocity—with no stops for scanning—of few millimeters per second can be provided, e.g. between 0.1-100 millimeter per second; length or width of a region of interest may be between 0.25 micron to 2 microns, e.g. 1 micron; and a length of the movement of stage during scan of the region of interest may be between 0.25 micron to 200 micron, e.g. 30 micron.

In many cases the first scan duration (time to complete the first scanning pattern) should be longer than the first period. For example—the first period may be too short for collecting enough electrons to provide an image of sufficient signal to noise ration. Thus—there is a need to lengthen the first scan duration—and this can be done without reducing the mechanical scanning by allowing the electron beam to impinge on the region of interest for a prolonged period (in relation to the first period) despite the mechanical movement. This can be done by scanning the first electron beam by a first scan pattern that includes a first countermovement element that counters the mechanical movement. This allows the scanning of the region of interest to have a first scan duration that is longer than the first period.

Figure 3:
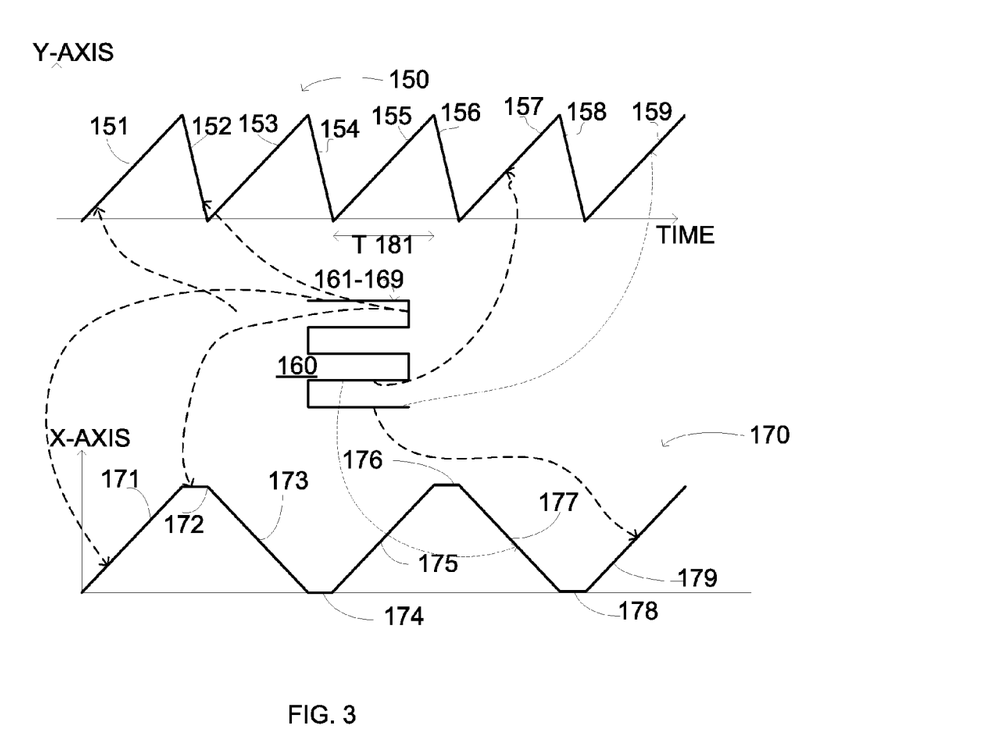
FIG. 3 illustrates a first scanning pattern, a first countermovement element of the first scanning pattern and another element of the scanning pattern according to an embodiment of the invention.

FIG. 3 illustrates a Y-AXIS scan control signal (graph 150) and a X-AXIS scan control signal (graph 170). These control signals cause the electron beam 45 to be scanned along X and Y axes respectively and illustrates the combination of the electron beam scam movement with the electron beam countermovement.

Graph 170 includes repeating sequences of (a) a positive orientated line (171, 175 and 179) for scanning the spot from left to right, (b) a horizontal section (172 and 176) for not introducing x-axis displacement when vertically moving the spot between two horizontal scan lines and (c) a negative oriented line (173 and 177) for scanning the spot from right to left.

Assuming that the wafer 39 moves vertically (from bottom to top) when scanning area 113, the Y-AXIS scan control signal 150 includes a countermovement element that counters the mechanical movement of the stage and wafer. Assuming a movement at a fixed velocity—the Y-AXIS control signal 150 includes an interleaving sequence of (a) positively oriented lines (151, 153, 155, 157 and 159) for countering the mechanical movement of the wafer and of (b) negatively oriented lines (152, 154, 156, 158) for performing the vertical portions (162, 164, 168 and 168) of the first scanning pattern 160.

It is noted that other electron beam scanning patterns may be applied—for example scanning patterns can be oriented to the mechanical movement of the wafer, may include rotational elements and may include polygons that differ by shape from a raster scan. Furthermore—the movement can be of non-fixed velocity.

According to various embodiments of the invention the overall area of all the regions of interest is a fraction (for example 1/Q, wherein Q exceeds 3) of an area of the wafer.

The first scan duration can be at least R time longer than the first period, wherein R may exceed 2.

Although the system 10 is illustrated in FIG. 1 as being able to scan the wafer with a single electron beam it may be adapted to scan the wafer with multiple electron beams. Duplication of the electron optics 99 or of some of its components, the addition of components such as a beam splitter and/or the removal of components illustrated in FIG. 1 can obtain the desired result. For example—a dual column electron optics may be able to produce multiple electron beams.

Figure 4:
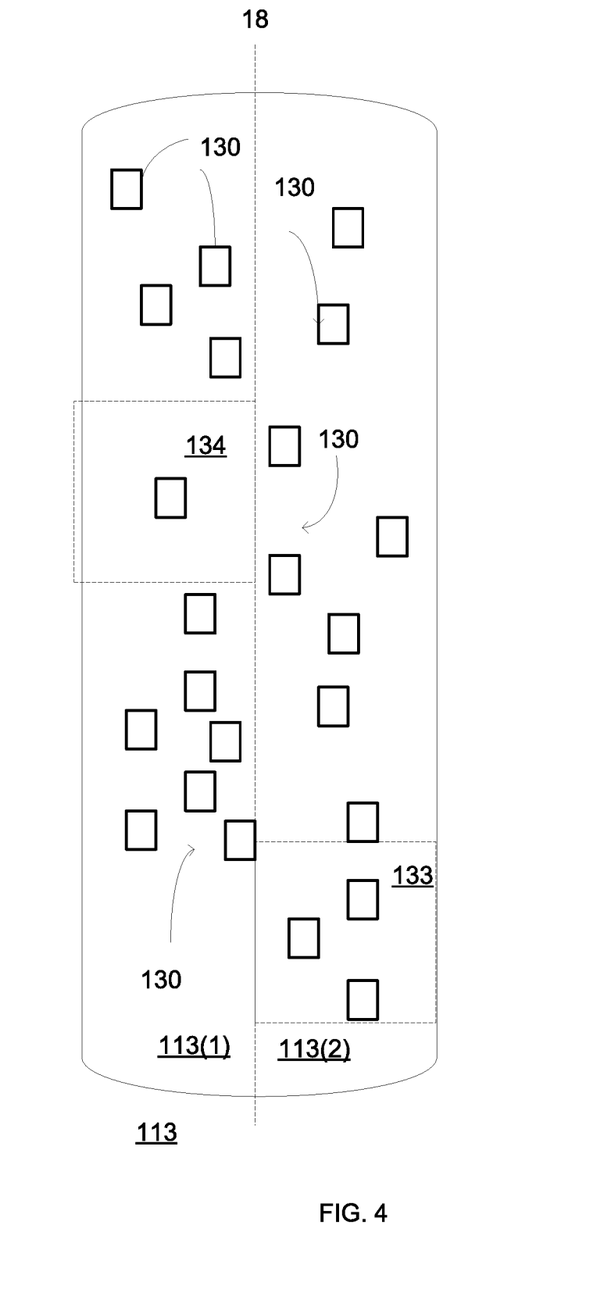
FIG. 4 illustrates an area of the wafer and multiple regions of interest embodiment of the invention.

FIG. 4 illustrates area 113 as being scanned by two electron beams. Area 13 is virtually split in its center by imaginary line 18 to provide areas 113(1) and 113(2)—one area 113(1) is scanned by a first electron beam and the second area 113(2) is e scanned by an additional, second electron beam. For simplicity of explanation the regions of interest in second area 131(2) are referred to as additional regions of interest.

Thus, the system may be arranged to scan additional regions of interest by a second electron beam, e.g. a double single-beam column configuration. The electron optics 99 is arranged to repeat, for each additional region of interest: direct the second electron beam towards the additional region of interest of the wafer; scan the additional region of interest according to a second scanning pattern of the second electron beam while moving the wafer, along the first direction, so that the additional region of interest passes in front of a second imaginary stationary point during a second period; wherein the second scanning pattern comprises a second countermovement portion than counters the mechanical movement thereby allowing the scanning of the additional region of interest to have a second scan duration that is longer than the second period.

According to an embodiment of the invention, the system may be arrange to scan the regions of interest by one or more electron beams, e.g. in a multi-column single beam configuration or by a single multi-beam column, as known in the art.

Figure 5:
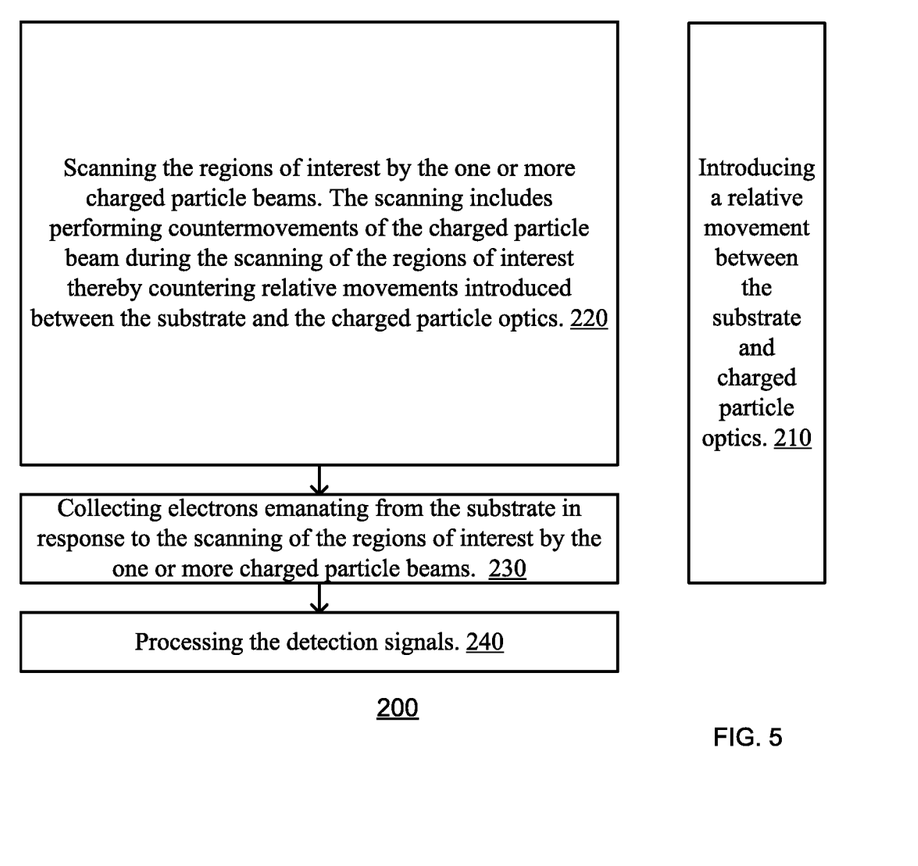

FIG. 5 illustrates method 200 according to an embodiment of the invention.

Method 200 is for scanning a plurality of regions of interest of a substrate.

Method 200 stars by stages 210 and 220.

Step 210 may include introducing a relative movement between the substrate and charged particle optics.

Step 220 is executed while introducing (210) of the relative movement.

Step 220 may include scanning the regions of interest by the one or more charged particle beams. The scanning includes performing countermovements of the charged particle beam during the scanning of the regions of interest thereby countering relative movements introduced between the substrate and the charged particle optics.

Step 220 may also include moving the one or more charged particle beams in movements that are not countermovements and even in movements that are at the same direction as the direction of the relative movement introduced by the stage.

Step 220 may also include scanning regions that are not regions of interest. This may occur when moving from one region of interest to the other.

Step 220 is followed by step 230 of collecting electrons emanating from the substrate in response to the scanning of the regions of interest by the one or more charged particle beams and generating detection signals indicative of the collected electrons.

Step 230 may be followed by step 240 of processing the detection signals.

According to an embodiment of the invention the processor 32 may control the scanning of regions of interest and may access a non-transitory computer readable medium (such as memory 33) and may read instructions that cause processor to control the scanning of the regions of interest. The non-transitory computer readable medium may store instructions that will cause system to execute method 200.

According an embodiment of the invention stage 220 may include scanning a same region of interest multiple times, wherein at least two scans differ from each other by an image acquisition condition such as focus plan, depth of focus, beam current, landing energy, resolution, and the like. The different scans may be used to reconstruct a three dimensional image of the region of interest. An image acquisition condition is a condition that once applied during an image acquisition process may affect the image obtained by the image acquisition process.

It is noted that different regions of interest may be of the shape and size. Alternatively—at least two regions of interest may differ from each other by shape and/or size. Different regions of interest may partially overlap or may not overlap. The shape and/or size of a region of interest may be determined in advance, determined during the scanning process of regions of interest, may be responsive to results of scanning one or more regions of interest and the like.

It is noted that the image acquisition occurs during the introduction of the relative movement between the substrate and charged particle optics and thus increases the throughput of the method. It may allow up to 100% grabbing efficiency time.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one.

Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an."

The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for scanning a plurality of regions of interest of a substrate using one or more charged particle beams, the system comprising:
    an irradiation module having charged particle optics;
    a stage for introducing a relative movement between the substrate and the charged particle optics;
    an imaging module for collecting electrons emanating from the substrate in response to multiple scans of a same region of interest by the one or more charged particle beams, wherein at least two scans of the multiple scans differ from each other by at least one image acquisition condition; and
    wherein the charged particle optics is arranged to perform countermovements of the charged particle beam during the scanning of the regions of interest thereby countering the relative movement introduced between the substrate and the charged particle optics during the scanning of the regions of interest, and wherein image acquisition occurs during introduction of the relative movement.

2. The system according to claim 1 wherein the charged particle optics is arranged to move the charged particle beam, during a scan of a region of interest, in a scan pattern along a first direction and along a second direction oriented with respect to the first direction, and wherein a performing of a countermovement of the charged particle beam comprises moving the charged particle beam along the first direction.

3. The system according to claim 1 wherein the stage is arranged to introduce the relative movement by moving the substrate at a constant speed; and wherein the charged particle optics is arranged to perform a countermovement of the charged particle beam under a control of a control signal having a saw tooth shape.

4. The system according to claim 1 comprising a controller that is arranged, for each combination of charged particle beam and a scan of a region of interest, to generate a control signal for adjusting a position of the charged particle beam in response to stage position information.

5. The system according to claim 1 wherein a length of the region of interest is between 0.25 micron to 2 microns and a length of a movement of stage during a scan of the region of interest is between 0.25 micron to 200 micron.

6. The system according to claim 1 wherein said charged particle optics is one of a group consisting of: a single charged particle column generating a single charged particle beam, a multi charged particle column structure wherein each charged particle column is generating a single beam, and a single charged particle column generating a plurality of charged particle beams.

7. The system according to claim 1 wherein the substrate is a wafer.

8. The system according to claim 1 wherein the substrate is a reticle.

9. The system according to claim 1 wherein the charged particle beam is an electron beam.

10. The system according to claim 1 wherein the charged particle beam is an ion beam.

11. The system according to claim 1 wherein the system is arranged to scan the one or more charged particle beams over an entire surface of the substrate.

12. The system according to claim 1 wherein an overall area of all the regions of interest is a fraction of an area of the wafer.

13. The system according to claim 1 wherein at least some regions of interest have an area that is less than one percent of the field of view.

14. The system according to claim 1 wherein at least two of the regions of interest differ from each other by at least one of shape or size.

15. A method for scanning a plurality of regions of interest of a substrate, the method comprising:
introducing a relative movement between the substrate and charged particle optics;
during the introducing of the relative movement, scanning the regions of interest by the one or more charged particle beams; wherein the scanning comprises performing countermovements of the charged particle beam during the scanning of the regions of interest thereby countering the relative movement introduced between the substrate and the charged particle optics; and
collecting electrons emanating from the substrate in response to multiple scans of a same region of interest by the one or more charged particle beams, wherein at least two scans of the multiple scans differ from each other by at least one image acquisition condition, and wherein image acquisition occurs during introduction of the relative movement.

16. The method according to claim 15 comprising moving the charged particle beam, during a scan of a region of interest, in a scan pattern along a first direction and along a second direction oriented with respect to the first direction, and wherein the performing of a countermovement of the charged particle beam comprises moving the charged particle beam along the first direction.

17. The method according to claim 15 comprising introducing the relative movement by moving the substrate at a constant speed; and performing the countermovement of the charged particle beam under a control of a control signal having a saw tooth shape.

18. The method according to claim 15 comprising generating, for each combination of charged particle beam and a scan of a region of interest, a control signal for adjusting a position of the charged particle beam in response to stage position information.

19. The method according to claim 15 wherein at least two of the regions of interest differ from each other by at least one of shape or size.

20. A system for scanning a plurality of regions of interest of a substrate using one or more charged particle beams, the system comprising:
an irradiation module having charged particle optics;
a stage for introducing a relative movement between the substrate and the charged particle optics;
an imaging module for collecting electrons emanating from the substrate in response to a scanning of the regions of interest by the one or more charged particle beams; and
wherein the charged particle optics is arranged to perform countermovements of the charged particle beam during the scanning of the regions of interest thereby countering the relative movement introduced between the substrate and the charged particle optics during the scanning of the regions of interest, wherein at least two of the regions of interest differ from each other by at least one of shape or size, and wherein image acquisition occurs during introduction of the relative movement.

* * * * *